United States Patent
Benson et al.

(10) Patent No.: US 6,885,180 B2
(45) Date of Patent: Apr. 26, 2005

(54) APPARATUS AND METHOD FOR ELECTRICAL CABLE IDENTIFICATION

(76) Inventors: Emory W. Benson, 1975 County Line Rd., Acworth, GA (US) 30101; Tim Foster, 876 Pea Ridge Rd., Ball Ground, GA (US) 30107

( * ) Notice: Subject to any disclaimer, the term of this patent is extended or adjusted under 35 U.S.C. 154(b) by 0 days.

(21) Appl. No.: 10/793,962

(22) Filed: Mar. 5, 2004

(65) Prior Publication Data

US 2004/0174153 A1 Sep. 9, 2004

Related U.S. Application Data

(60) Provisional application No. 60/452,583, filed on Mar. 6, 2003.

(51) Int. Cl.$^7$ .............................................. G01R 19/00
(52) U.S. Cl. ........................................ 324/66; 324/539
(58) Field of Search ........................... 324/66, 67, 509, 324/539, 541; 375/258

(56) References Cited

U.S. PATENT DOCUMENTS

| | | |
|---|---|---|
| 3,375,334 A | 3/1968 | Robinson |
| 3,424,874 A | 1/1969 | Young |
| 3,609,538 A | 9/1971 | Schag |
| 3,902,026 A | 8/1975 | Rogers et al. |
| 4,906,938 A | 3/1990 | Konopka |
| 5,109,200 A | 4/1992 | Dushane et al. |
| 5,493,206 A | 2/1996 | Boons |
| 5,497,094 A * | 3/1996 | George ........................ 324/529 |
| 5,909,113 A * | 6/1999 | Clement et al. ............... 324/66 |
| 5,969,516 A | 10/1999 | Wottrich |
| 6,154,032 A | 11/2000 | Coia et al. |
| 6,163,144 A | 12/2000 | Steber et al. |
| 6,166,532 A | 12/2000 | Coia et al. |
| 6,392,395 B1 | 5/2002 | Roberts et al. |
| 6,466,029 B1 | 10/2002 | Stroth et al. |

* cited by examiner

*Primary Examiner*—Anjan Deb
*Assistant Examiner*—Walter Benson
(74) *Attorney, Agent, or Firm*—Howard C. Miskin, Esq.; Gloria Tsui-Yip, Esq.

(57) ABSTRACT

An apparatus and method for electrical cable identification that is both expeditiously and easily deployed, lightweight to facilitate on-person portability, and provides quick on-site identification of both primary and secondary cables, including grounded secondary cables/conductors.

27 Claims, 6 Drawing Sheets

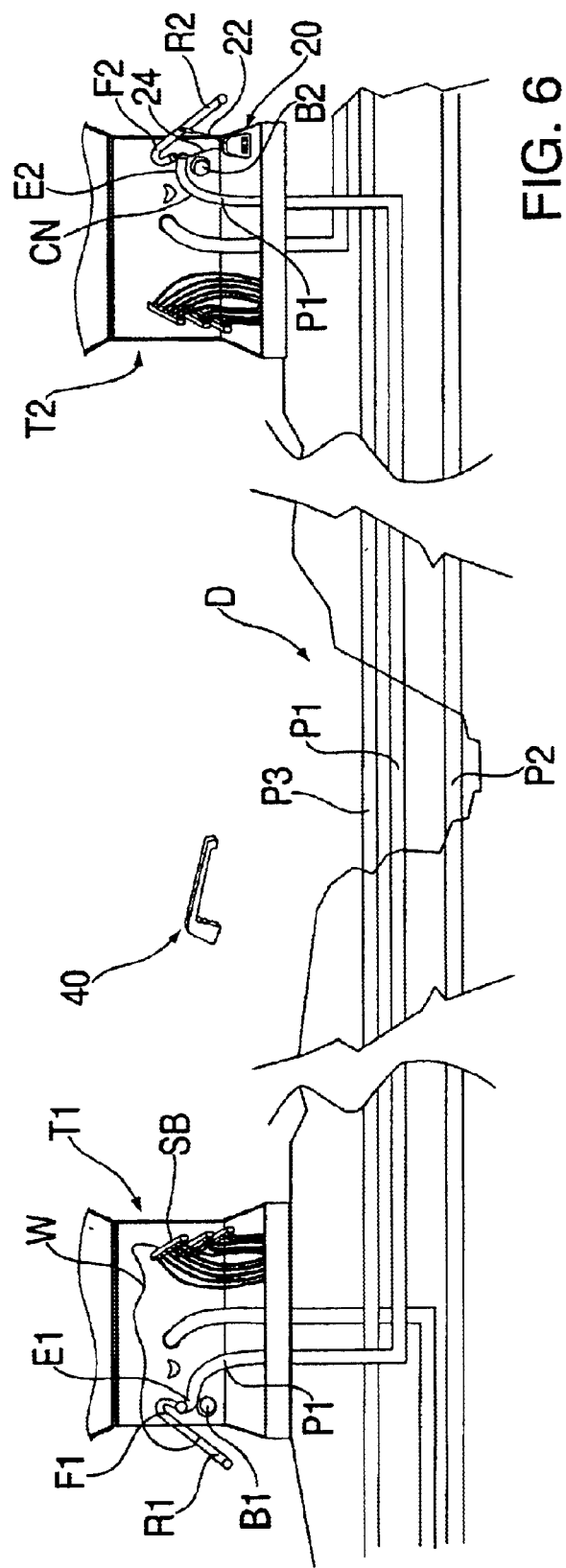

APPARATUS AND METHOD FOR ELECTRICAL CABLE IDENTIFICATION

CROSS-REFERENCE AND PRIORITY CLAIM TO RELATED APPLICATIONS

To the fullest extent permitted by law, the present non-provisional patent application claims priority to and the full benefit of provisional patent application entitled "APPARATUS AND METHOD FOR ELECTRICAL CABLE IDENTIFICATION", filed on Mar. 6, 2003, having assigned Ser. No. 60/452,583.

TECHNICAL FIELD

The present invention relates generally to electrical testing devices, and more specifically to an apparatus and method for electrical cable identification. The present invention is particularly suitable for, although not strictly limited to, assisting linemen with on-site primary and secondary electrical cable identification.

BACKGROUND OF THE INVENTION

Prior to conducting any electrical repair or modification to existing transformers and associated secondary electrical cabling, electrical linemen must first identify the relevant cabling upon which to work. In particular, a linemen must generally determine which particular cables, amongst a plurality of secondary cables in a transformer, lead to the meter base of a particular building structure, or which particular cables, amongst a plurality of secondary cables uncovered or unearthed in a dug pit, lead to the meter base of a building structure, or which desired cable to splice.

To accomplish such cable identification, the linemen are typically forced to systematically detach secondary cables from the transformer to determine which building structure the secondary cables run to, and thus supply power to, wherein such a determination is made upon the detection of a cessation of electrical current to a particular building structure. Such a method bears obvious ramifications, as several building dwellers will experience a brief period of power outage until the desired cables and associated building structure are identified, thus causing potentially detrimental cessations in business operations, loss of unsaved computer documentation, and generally untimely inconvenience.

Additionally, although terminal ends of primary cables leading from one transformer to another transformer are identifiable, it often becomes difficult to identify phases of primary cables unearthed or exposed in a dug pit, wherein such identification is determined for purposes of splicing in an additional transformer to service new secondary users, and wherein each appropriate or desired phases of primary cables must be identified for splicing.

Although equipment is available for identification of primary and secondary cables, such equipment is very large, heavy and bulky, overly complex to implement, and extremely expensive, and, as such, are rarely utilized by linemen, or issued as standard equipment to linemen by their electrical servicing company. Additionally, the overall bulky or cumbersome nature of such equipment makes the deployment or implementation of same burdensomely difficult, especially when attempting to work the equipment in between a plurality of generally closely positioned secondary cables. Moreover, carrying such weighty equipment into and out of dug pits or ditches is undoubtedly a physically strenuous task.

Therefore, it is readily apparent that there is a need for an apparatus and method for electrical cable identification that is expeditious, inexpensive, lightweight, personally portable and easy to implement, wherein both primary and secondary cables, including grounded secondary cables/conductors, may be identified without the aforementioned disadvantages.

BRIEF SUMMARY OF THE INVENTION

Briefly described, in a preferred embodiment, the present invention overcomes the above-mentioned disadvantages and meets the recognized need for such a device by providing an apparatus and method for electrical cable identification that is expeditiously and easily deployed, lightweight to facilitate on-person portability, and provides quick on-site identification of both primary and secondary cables, including grounded secondary cables/conductors.

According to its major aspects and broadly stated, the present invention in its preferred form is an apparatus and method for electrical cable identification of both primary and secondary cables, wherein the apparatus and method preferably generally employs transmitter and receiver technology for identification of cables in a transformer, ditch, construction pit, or the like.

More specifically, the present invention is a novel apparatus and method for electrical cable identification utilized to determine which particular cables, amongst a plurality of secondary cables in a transformer, lead to the meter base of a particular house, dwelling or building. The device is preferably utilized to avoid having to systematically detach secondary cables from the transformer in determining which house or building the secondary cables run to, and thus supply power to. The device is further preferably utilized to identify grounded secondary cables/conductors that are otherwise difficult to identify without implementation of the aforementioned disadvantageous methods. The device is also preferably utilized to determine which particular cables, amongst a plurality of secondary cables uncovered or unearthed in a dug pit, lead to the meter base of a particular house, dwelling or building, or for purposes of determining which desired cables to splice.

Preferably, the apparatus of the present invention entails the use of a transmitter and structurally novel receiver, wherein the transmitter comprises a hot wire and a neutral wire extending therefrom. The hot wire and neutral wire preferably electrically engage the hot and neutral terminals, respectively, of a conventional meter base for transmitting an electrical signal therefrom through the corresponding secondary ungrounded conductor/cable and secondary grounded conductor/cable, respectively, wherein a magnetic field is created within the vicinity of the corresponding ends of the secondary ungrounded cable and secondary grounded cable attached to the transformer. Thereafter, the lineman or other user of the device preferably goes back to the transformer or ditch and proceeds to aim the receiver at the plurality of secondary cables within the transformer, adjusting the sensitivity of the receiver until a visual light, auditory buzzer or other signaling means is emitted from the receiver when aligned over the correct cables, thereby identifying the appropriate secondary ungrounded cable and secondary grounded cable amongst the plurality of secondary cables therein. The user preferably adjusts the sensitivity of the receiver via a sensitivity control circuit so that the receiver only detects the desired secondary cables via the magnetic field generated thereabout via the transmitter.

The present invention is also suitable for identifying unmarked or unidentified primary cables unearthed or exposed in a dug pit for purposes of splicing in a new transformer to service new meter bases, or the like, wherein each appropriate or desired phase of primary cable must be identified to electrically couple a transformer thereto. Preferably, the receiver-transmitter device of the present invention is also utilized in this novel method of primary cable detection or identification. Specifically, the primary cable of one transformer (hereinafter referred to as "transformer 1") is disconnected and engaged with a two-way feed in transformer 1, wherein the labeled or known corresponding end of the same primary cable of a different transformer (hereinafter referred to as "transformer 2") is disconnected and engaged with a two-way feed in transformer 2, thus killing the current between transformer 1 and transformer 2 by de-energizing the primary cable, as is known within the art. Thereafter, each two-way feed, of transformers 1 and 2, receives a buzz rod. Preferably, one end of a power transfer wire is engaged to the buzz rod of transformer 1, wherein the other end of the power transfer wire is engaged to the 120 Volt Secondary Bar of transformer 1, thus, the previously killed/de-energized primary cable is now reenergized with a 120 Volt current running therethrough. Thereafter, in transformer 2, where the corresponding end of the primary cable is attached, the transmitter is electrically engaged therewith via the aforementioned hot and neutral wires. The hot wire preferably engages the buzz rod of transformer 2, and neutral wire preferably engages a concentric neutral rod of transformer 2, and thus transmits the electrical and magnetic signal therefrom. A user of the device, then goes back to the pit or ditch in which all primary cables have been exposed, and proceeds to aim the receiver at the primary cables, and adjusts the sensitivity of the receiver until a visual light, auditory buzzer or other signaling means is emitted from the receiver when aligned over the correct primary cable, thus identifying the appropriate cable amongst the plurality of cables therein, and allowing the correct phase splicing of the so-identified primary cable.

The present invention also contemplates the restructuring/development of a more structurally functional receiver tool to facilitate use in transformers and the like, thus permitting the receiver to be worked between the cables, and to permit proper alignment of the receiver with the cable for purposes of effective cable identification.

Accordingly, a feature and advantage of the present invention is its ability to identify both primary and secondary cables, including difficult to identify secondary grounded cables.

Another feature and advantage of the present invention is its ability to determine which particular secondary cables, amongst a plurality of secondary cables in a transformer, lead to the meter base of a building structure.

Another feature and advantage of the present invention is its ability to determine which particular secondary cables, amongst a plurality of secondary cables uncovered or unearthed in a dug pit, lead to the meter base of a particular house, dwelling or building, or for purposes of determining which desired cables to splice.

Another feature and advantage of the present invention is its ability to identify unmarked or unidentified primary cables unearthed or exposed in a dug pit for purposes of splicing in a new transformer to service new meter bases, or the like, wherein each appropriate or desired phase of primary cable must be identified to electrically couple a transformer thereto.

Another feature and advantage of the present invention is its ability to eliminate prior art methods of systematic detachment of secondary cables from the transformer in order to determine to which house or building the secondary cables run, and thus supply power.

Another feature and advantage of the present invention is its ability to be both expeditiously and easily implemented.

Another feature and advantage of the present invention is its inexpensiveness, thus permitting economical use by all linemen and/or economical issuance as standard equipment by an electrical service company to their linemen.

Another feature and advantage of the present invention is its lightweight aspect and personal portability, thus facilitating easy carrying of same into and out of dug pits or ditches.

Another feature and advantage of the present invention is its ability to be easily worked in between a plurality of generally closely positioned secondary cables.

These and other objects, features and advantages of the present invention will become more apparent to one skilled in the art from the following description and claims when read in light of the accompanying drawings.

BRIEF DESCRIPTION OF THE DRAWINGS

The present invention will be better understood by reading the Detailed Description of the Preferred and Alternate Embodiments with reference to the accompanying drawing figures, in which like reference numerals denote similar structure and refer to like elements throughout, and in which.

DETAILED DESCRIPTION OF THE PREFERRED AND ALTERNATIVE EMBODIMENTS

Figure 1:
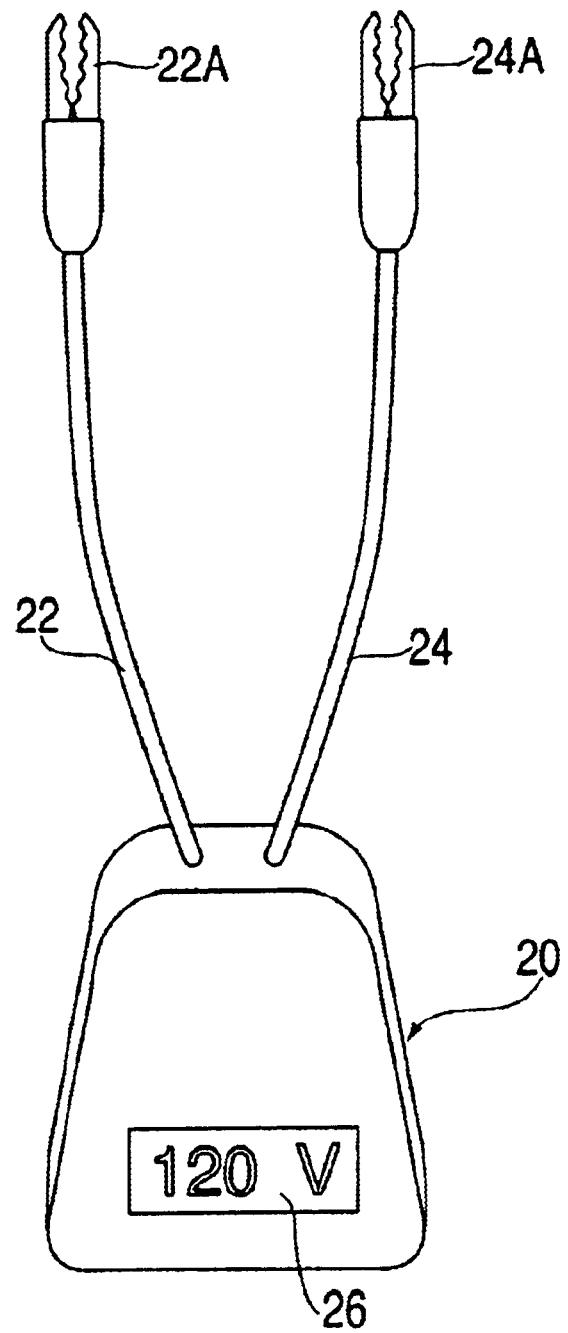
FIG. 1 is a perspective view of the transmitter of an apparatus and method for electrical cable identification according to a preferred embodiment of the present invention.
Figure 2:
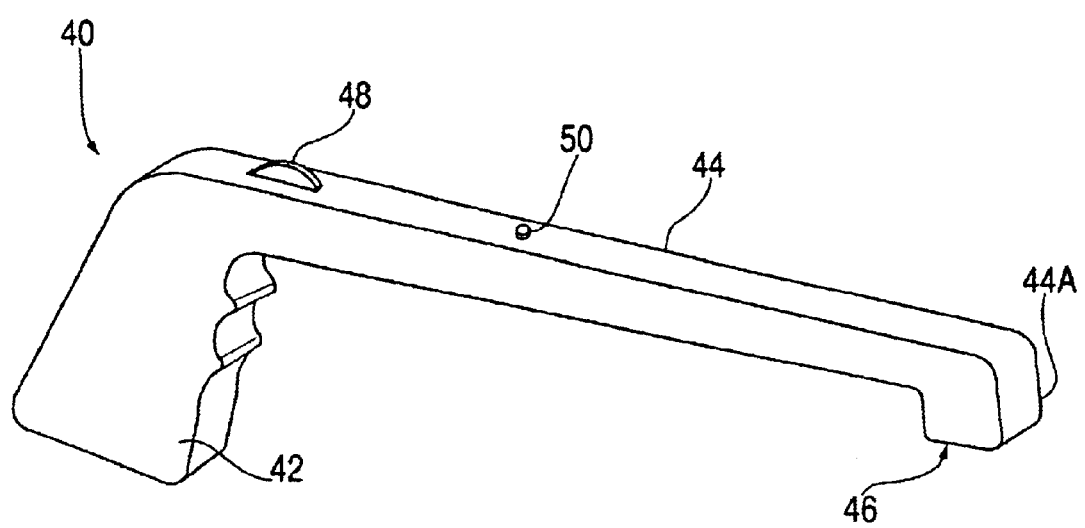
FIG. 2 is a perspective view of the receiver of an apparatus and method for electrical cable identification according to a preferred embodiment of the present invention.

In describing the preferred and alternate embodiments of the present invention, as illustrated in FIGS. 1–6, specific terminology is employed for the sake of clarity. The invention, however, is not intended to be limited to the specific terminology so selected, and it is to be understood that each specific element includes all technical equivalents that operate in a similar manner to accomplish similar functions.

Referring now to FIGS. 1–5, the present invention in a preferred embodiment is an apparatus and method for electrical cable identification having, in general, transmitter 20 and receiver 40. Preferably, transmitter 20 and receiver 40 incorporate conventional receiver-transmitter technology and circuitry as utilized in available household circuit breaker or circuit interrupter identification devices. As more fully described below, and via incorporation of such existing technology, electrical engagement of transmitter 20 to the terminal end of secondary cables within a meter box or transformer preferably results in transmitter 20 emitting an identification signal therefrom and therethrough, wherein a pickup or sensing coil of receiver 40 is preferably adapted to sense the magnetic field generated by the identification signal flowing through the cables to which transmitter 20 is electrically engaged, thus enabling identification of the desired cables. Examples of such conventional circuit breaker or circuit interrupter identification devices may be seen with reference to U.S. Pat. No. 4,906,938 to Konopka and U.S. Pat. No. 5,969,516 to Wottrich, and are incorporated herein by reference; although other similar circuitry is contemplated within the present invention. It must be recognized, however, as the present invention involves identification of high-voltage primary and secondary power cables, and not circuit breakers or interrupters, the above-referenced incorporated circuitry and technology is capable of identifying desired primary and secondary cabling only upon implementation of the preferred and/or alternate methodology as described herein, and/or obvious variations thereof, as well as utilization of a functionally and structurally novel receiver 40 in conjunction therewith.

Preferably, transmitter 20 comprises hot wire or lead 22 and neutral wire or lead 24 extending therefrom, wherein hot lead 22 and neutral lead 24 preferably terminate in alligator-style clips 22A and 24A, respectively, to facilitate engagement of hot lead 22 and neutral lead 24, respectively, to desired electrical junctions, as more fully described below. Transmitter 20 further comprises digital display 26 positioned thereon for purposes of digitally displaying the voltage between the grounded and ungrounded secondary conductors/cables, or alternatively, and depending upon operating environments, between a first and second ungrounded cable, as more fully described below. By drawing an electrical current, transmitter 20 perturbs the electrical frequency of the cables for generation of a magnetic field therethrough, as more fully described below.

Preferably, receiver 40 is substantially pistol-shaped, having handle 42 and elongated muzzle or nose 44 extending therefrom, wherein nose 44 preferably terminates in downwardly angled end 44A. Preferably, sensing coil 46 is positioned within end 44A, wherein the functionally and structurally novel elongated nose 44 preferably permits end 44A thereof, and, as such, sensing coil 46, to be worked between tightly or closely disposed cables in a transformer or the like, thus further permitting proper alignment of sensing coil 46 over the cables for purposes of effective cable identification, as more fully described below. Receiver 40 further preferably comprises sensitivity control 48 for adjusting the sensitivity of sensing coil 46 to facilitate detection and identification of the desired cables through which the identification signal is being transmitted, and from which a corresponding magnetic field is being generated, as more fully described below. Additionally, visual display 50, preferably in the form a light-emitting-diode (LED), is also positioned on receiver 40, and preferably functions in conjunction with an audible buzzer (not shown) or other signaling means to indicate which cables are transmitting or carrying the sought magnetic field.

Figure 3:
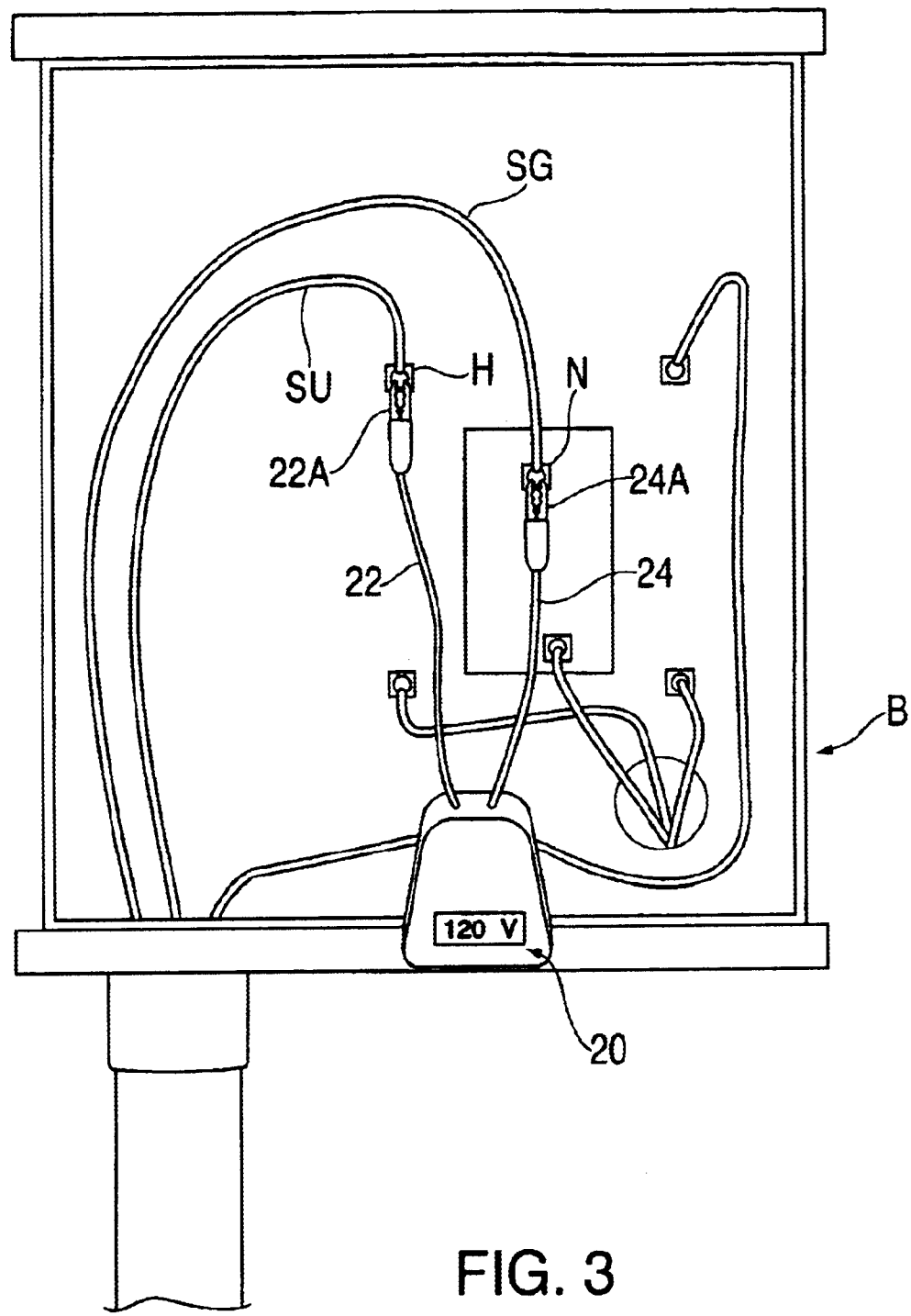
FIG. 3 is a perspective view of the transmitter of an apparatus and method for electrical cable identification according to a preferred embodiment of the present invention, shown electrically engaged to a conventional meter base.
Figure 4:
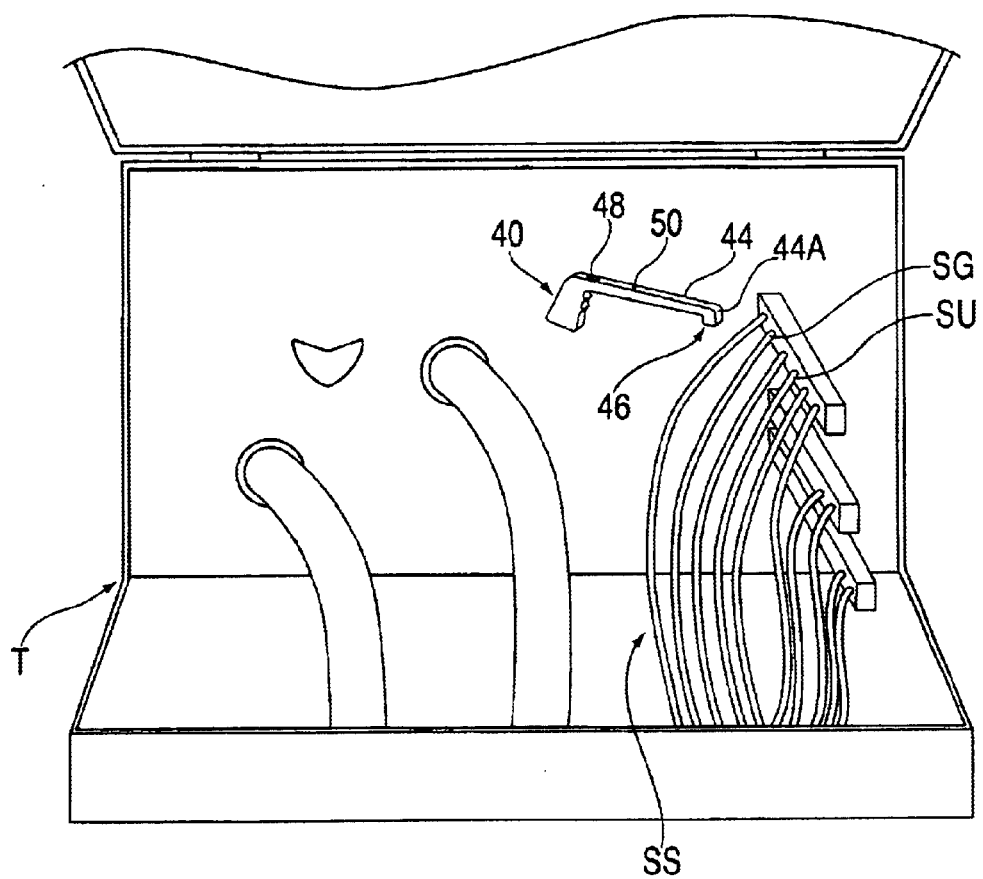
FIG. 4 is a perspective view of the receiver of an apparatus and method for electrical cable identification according to a preferred embodiment of the present invention, shown proximal secondary cables in a transformer.
Figure 5:
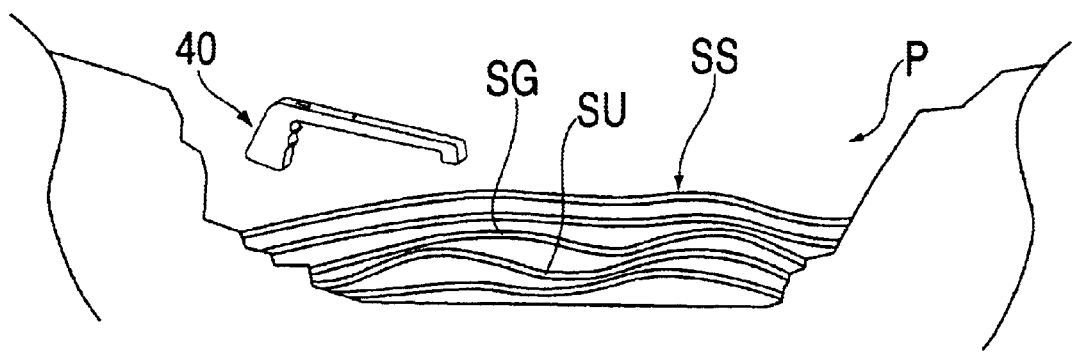
FIG. 5 is a perspective view of the receiver of an apparatus and method for electrical cable identification according to a preferred embodiment of the present invention, shown proximal secondary cables in a dug pit; and, FIG. 6 is an illustrative view of an apparatus and method for electrical cable identification according to a preferred embodiment of the present invention, shown in use for identification of primary cables.

Referring now more specifically to FIGS. 3–5, preferably, to determine which particular secondary cables, amongst a plurality of secondary cables in a transformer or dug pit, lead to the meter base of a building structure, or for purposes of determining which desired secondary cables to splice, transmitter 20 and receiver 40 are utilized in the following preferred method of secondary cable identification. It must be appreciated that the present method eliminates prior art methods of systematic detachment of secondary cables from the transformer in order to determine to which building structure the appropriate secondary cables run, and thus supply power.

Preferably, via clips 22A and 24A, hot lead 22 and neutral lead 24, respectively, of transmitter 20 preferably electrically engage hot terminal H and neutral terminal N of conventional meter base B for utilizing electrical current passage therethrough and, thus, transmitting an electrical identification signal therefrom and through secondary ungrounded cable SU and secondary grounded cable SG, respectively, or alternatively, and depending upon operating environments, through a first and second ungrounded cable, respectively. Preferably, the electrical identification signal creates a magnetic field through secondary cables SU and SG of meter base B. However, as best illustrated in FIG. 4, due to the plurality of closely disposed secondary cables SS in transformer T, the magnetic field generated by secondary cables SU and SG of meter base B will be sensed within the general vicinity of the plurality of secondary cables SS in transformer T. As such, to clearly detect and identify secondary cables SU and SG of meter base B from the plurality of secondary cables SS in transformer T, a lineman, or other user of receiver 40, preferably works nose 44 of receiver 40 between the plurality of secondary cables SS and positions sensing coil 46 of end 44A of receiver 40 over individual secondary cables of the plurality of secondary cables SS, adjusting the sensitivity of receiver 40 via sensitivity control 48 to detect the magnetic field being emitted from secondary cables SU and SG. The sensitivity of receiver 40 is preferably adjusted until visual display 50 and audible signal are emitted therefrom, indicating that sensing coil 46 is aligned over the correct secondary cables SU and SG amongst the plurality of secondary cables SS in transformer T.

Preferably, as best illustrated in FIG. 5, the above-described method is preferably also utilized to detect and identify the identification signal, and corresponding magnetic field, being generated by secondary cables SU and SG of meter base B amongst a plurality of secondary cables SS in a dug ditch or pit P, for splicing purposes, repair, or the like.

Referring now more specifically to FIG. 6, the present invention is also suitable for identifying unmarked or unidentified primary cables unearthed or exposed in a dug pit for purposes of splicing the appropriate or desired phase of primary cable to create a transformer electrically coupled thereto. Preferably, transmitter 20 and receiver 40 are also utilized in this novel method of primary cable detection or identification. Preferably, FIG. 6 illustrates three phases of primary cable, P1, P2 and P3, wherein although each opposing end of primary cable, P1, P2 and P3 may be known, identified or labeled, it is the section of primary cable P1, P2 or P3 as unearthed within ditch D that must be identified. As such, for exemplary purposes only, should it be desired that primary cable P1 be spliced (although any phase of primary cable could be utilized), end E1 of primary cable P1 is disconnected from bushing B1 of transformer T1 and engaged with a feed-through F1 in transformer T1, wherein the term feed-through is synonymous with 2-way feed-through or feed-through bushing. Preferably, the labeled or known corresponding end E2 of primary cable P1 is disconnected from bushing B2 of a distant transformer T2, thus killing the current between primary cable P1 leading from transformer T1 to transformer T2, as is known within the art. Primary cable P1 is subsequently preferably re-engaged with feed-through F2 in transformer T2.

Thereafter, feed-through F1 and F2, of transformers T1 and T2, respectively, receive test rod R1 and R2, respectively, wherein test rod R1 and R2 are also referred to as buzz rods. Preferably, one end of a reenergizing wire W is engaged to test rod R1 of transformer T1, wherein the opposing end of reenergizing wire W is preferably engaged to a 120 Volt Secondary Bar SB in transformer T1, thus, reenergizing the previously killed/de-energized primary cable P1 with a 120 Volt current running therethrough. Thereafter, in transformer T2, hot lead 22 of transmitter 20 preferably engages test rod R2 of transformer T2, and neutral lead 24 preferably engages the concentric neutral CN formed at end E2 of primary cable P1. Transmitter 20 preferably draws current from the 120 Volt current running through primary cable P1, perturbs the frequency by its load, and thus, transmits the identification signal through primary cable P1 for generation of the corresponding magnetic field therethrough. A user of receiver 40 preferably goes to ditch D in which at least a portion of all primary cables P1, P2 and P3 have been exposed, and proceeds to position and align sensing coil 46 of end 44A of receiver 40 over primary cables P1, P2 and P3, adjusting the sensitivity of receiver 40 via sensitivity control 48 to detect the magnetic field being emitted from primary cable P1. The sensitivity of receiver 40 is preferably adjusted until visual display 50 and audible signal are emitted therefrom, indicating that sensing coil 46 is aligned over primary cable P1 amongst primary cable P2 and P3 in ditch D, thereby allowing the correct phase splicing of primary cable P1.

It is contemplated in an alternate embodiment that the present invention could be utilized to identify any number of secondary cables and/or phases of primary cables.

It is contemplated in an alternate embodiment that a plurality of transmitters 20 and receivers 40 could be simultaneously utilized to detect different phases of primary cable by reenergizing each phase with a different voltage, thus permitting each transmitter 20 to emit a specific identification signal and corresponding magnetic field through each corresponding primary cable for detection by receivers 40.

It is contemplated in an alternate embodiment that a plurality of different methods for de-energizing and reenergizing primary cables for identification purposes could be utilized without departing from the appreciative scope of the present invention, as such methods are in full contemplation by the inventors' in describing the present invention herein. For instance, it is contemplated that a user could de-energize a selected primary cable between transformers T1 and T2, and thereafter, "park" the terminal ends E1 and E2 of the de-energized primary cable on parking stands within respective transformers T1 and T2. Subsequently, the user could isolate the concentric neutral CN of end E1 of the primary cable in transformer T1, and, thereafter, connect neutral lead 24 of transmitter 20 to the isolated concentric neutral CN, and connect hot lead 22 of transmitter 20 to a 120 Volt Secondary Bar SB in transformer T1. A user of receiver 40 may then go back to ditch D and proceed to identify the primary cables, as described above.

It is contemplated in an alternate embodiment that a plurality of different field tools for electrically engaging transmitter 20 to meter base B or transformer T2 could be utilized without departing from the appreciative scope of the present invention, as such tools are in full contemplation by the inventors' in describing the present invention herein.

It is contemplated in an alternate embodiment that a transmitter 20 could be electrically engaged to meter base B or transformer T2 directly or through use of select field tools without departing from the appreciative scope of the present invention, as such methods are in full contemplation by the inventors' in describing the present invention herein.

It is contemplated in an alternate embodiment that a receiver 40 could comprise an automatic sensitivity control that would automatically adjust the sensitivity of receiver 40 for purposes of identifying the proper cable.

It is contemplated in an alternate embodiment that a transmitter 20 and receiver 40 could function on RF signals, including any frequency modulated and/or amplitude modulated signals.

Having thus described exemplary embodiments of the present invention, it should be noted by those skilled in the art that the within disclosures are exemplary only, and that various other alternatives, adaptations, and modifications may be made within the scope of the present invention. Accordingly, the present invention is not limited to the specific embodiments illustrated herein, but is limited only by the following claims.

What is claimed is:

1. A method for identifying which live current secondary cable in a transformer, amongst a plurality of live current secondary cables in the transformer, leads to a selected meter base, said method comprising the steps of: a. engaging a transmitter to the selected meter base; b. drawing a current with said transmitter; c. generating an electrical identification signal with said transmitter by way of the current; d. passing said electrical identification signal through a selected live current secondary cable leading from the selected meter base to the transformer for generating a magnetic field around the selected live current secondary cable; e. positioning a receiver within the transformer proximate to the terminal ends of the plurality of live current secondary cables in the transformer; and, f. moving said receiver over the terminal ends of each live current secondary cable in the transformer to sense and detect said magnetic field being generated around the terminal end of the selected live current secondary cable, thereby identifying which live current secondary cable in the transformer, amongst the plurality of live current secondary cables in the transformer, leads to the selected meter base.

2. The method of claim 1, wherein said transmitter comprises a hot lead and a neutral lead for electrically engaging a hot terminal and a neutral terminal, respectively of the meter base.

3. The method of claim 2, wherein said receiver comprises an elongated and narrow nose, said nose comprising a sensing coil disposed at the end thereof, said sensing coil adapted to sense and detect said magnetic field, and wherein said elongated and narrow nose of said receiver is adapted to be worked and maneuvered between and around closely disposed live current secondary cables in the transformer.

4. The method of claim 3, further comprising the step of g.: working and maneuvering said elongated and narrow nose of said receiver between or around the terminal ends of the plurality of live current secondary cables in the transformer to effectively position said sensing coil of said nose adjacent each terminal end of each of the plurality of live current secondary cables.

5. The method of claim 4, further comprising the step of h.: adjusting the sensitivity of said sensing coil to facilitate sensing and detecting of said magnetic field by same.

6. The method of claim 5, further comprising the step of i.: adjusting the sensitivity of said sensing coil until an audible or visual signal indicates that said sensing coil of said receiver is aligned adjacent the terminal end of the selected live current secondary cable comprising said magnetic field being generated therearound, thereby identifying which live current secondary cable in the transformer, amongst the plurality of live current secondary cables in the transformer, leads to the selected meter base.

7. A method of identifying which live current secondary cable unearthed in a dug pit, amongst a plurality of live current secondary cables unearthed within the dug pit, leads to a selected meter base, said method comprising the steps of: a. engaging a transmitter to the selected meter base; b. drawing a current with said transmitter; c. generating an electrical identification signal with said transmitter by way of the current; d. passing said electrical identification signal through a selected live current secondary cable leading from the selected meter base to the transformer for generating a magnetic field around the selected live current secondary cable; e. positioning a receiver within the dug pit proximate to the plurality of live current secondary cables running therethrough; and, f. moving said receiver adjacent the plurality of live current secondary cables running through the dug pit to sense and detect said magnetic field being generated around the selected live current secondary cable, thereby identifying which live current secondary cable in the dug pit, amongst the plurality of live current secondary cables running through the dug pit, leads to the selected meter base.

8. The method of claim 7, wherein said transmitter comprises a hot lead and a neutral lead for electrically engaging the hot terminal and neutral terminal, respectively of the meter base.

9. The method of claim 8, wherein said receiver comprises an elongated and narrow nose, said nose comprising a sensing coil disposed at the end thereof, said sensing coil adapted to sense and detect said magnetic field, and wherein said elongated and narrow nose of said receiver is adapted to be worked and maneuvered between and around closely disposed live current secondary cables running through the dug pit.

10. The method of claim 9, further comprising the step of g.: working and maneuvering said elongated and narrow nose of said receiver between or around the plurality of live current secondary cables running through the dug pit to effectively position said sensing coil of said nose adjacent each live current secondary cable of the plurality of live current secondary cables.

11. The method of claim 10, further comprising the step of h.: adjusting the sensitivity of said sensing coil to facilitate sensing and detecting of said magnetic field by same.

12. The method of claim 11, further comprising the step of i.: adjusting the sensitivity of said sensing coil until an audible or visual signal indicates that said sensing coil of said receiver is aligned adjacent the selected live current secondary cable comprising said magnetic field being generated therearound, thereby identifying which live current secondary cable in the dug pit, amongst the plurality of live current secondary cables running through the dug pit, leads to the selected meter base.

13. A method of identifying a phase of live current primary cable unearthed in a dug pit amongst a plurality of phases of live current primary cables unearthed within the dug pit, wherein each phase of live current primary cable extends from a first transformer to a second transformer, said method comprising the steps of: a. de-energizing a selected phase of live current primary cable between the first and second transformers; b. reenergizing the selected phase of live current primary cable with a selected voltage; c. engaging a transmitter to the second transformer; d. drawing the selected voltage with said transmitter; e. generating an electrical identification signal with said transmitter by way of the selected voltage; f. passing said electrical identification signal through the selected phase of live current primary cable for generating a magnetic field therearound; g. positioning a receiver within the dug pit proximate to the plurality of phases of live current primary cables running therethrough; and, h. moving said receiver adjacent the plurality of phases of live current primary cables running through the dug pit to sense and detect said magnetic field being generated around the selected phase of live current primary cable, thereby identifying same.

14. The method of claim 13, wherein said step of de-energizing a selected phase of live current primary cable between the first and second transformers comprises the step of disconnecting a first end of the selected phase of live current primary cable from a bushing in the first transformer, and engaging the first end to a feed-through in the first transformer.

15. The method of claim 14, further comprising the step of disconnecting a second and opposing end of the selected phase of live current primary cable from a bushing in the second transformer, thus terminating the current in the selected phase of live current primary cable leading from the first transformer to the second transformer.

16. The method of claim 15, further comprising the step of re-engaging the selected phase of live current primary cable with a feed-through in the second transformer.

17. The method of claim 16, wherein said step of reenergizing the selected phase of live current primary cable with a selected voltage comprises the step of engaging a first test rod to the feed-through of the first transformer, and a second test rod to the feed-through of the second transformer.

18. The method of claim 17, further comprising the step of engaging a first end of a reenergizing wire to the first test rod of the first transformer, wherein a second and opposing end of the reenergizing wire is engaged to a secondary voltage source in the first transformer, thus, reenergizing the selected primary cable with the selected voltage running therethrough.

19. The method of claim 18, wherein said step of engaging a transmitter to the second transformer comprises the step of engaging a hot lead of said transmitter to the second test rod of the second transformer, and engaging a neutral lead of said transmitter with a concentric neutral disposed at the second end of the selected live current primary cable.

20. The method of claim 19, wherein said step of drawing the selected voltage with said transmitter comprises the step of perturbing the frequency of said transmitter by its load, thereby resulting in implementation of said steps of generating an electrical identification signal with said transmitter by way of the selected voltage, and passing said electrical identification signal through the selected phase of live current primary cable for generating a magnetic field therearound.

21. The method of claim 20, wherein said receiver comprises an elongated and narrow nose, said nose comprising a sensing coil disposed at the end thereof, said sensing coil adapted to sense and detect said magnetic field, and wherein said elongated and narrow nose of said receiver is adapted to be worked or maneuvered between or around closely disposed live current primary cables running through the dug pit.

22. The method of claim 21, further comprising the step of i.: working and maneuvering said elongated and narrow nose of said receiver between or around the plurality of phases of live current primary cables running through the dug pit to effectively position said sensing coil of said nose adjacent each phase of live current primary cable of the plurality phases of live current primary cables.

23. The method of claim 22, further comprising the step of j.: adjusting the sensitivity of said sensing coil to facilitate sensing and detecting of said magnetic field by same.

24. The method of claim 23, further comprising the step of k.: adjusting the sensitivity of said sensing coil until an audible or visual signal indicates that said sensing coil of said receiver is aligned adjacent the selected phase of live current primary cable comprising said magnetic field being generated therearound, thereby identifying same amongst the plurality of phases of live current primary cables running through the dug pit.

25. A receiver for selectively identifying live current primary and secondary cables, said receiver comprising: a handle defining a vertical axis; an elongated nose substantially perpendicular to said vertical axis having a distal angled end substantially parallel to said vertical axis; a sensing coil positioned within said distal angled end for maneuvering said receiver between closely disposed cables; a sensitivity control for adjusting the sensitivity of said receiver for detecting magnetic fields generated around said cables; and, an indicator means for indicating proper identification of said magnetic field generated around said cables.

26. A method of identifying which grounded secondary cable and ungrounded secondary cable in a transformer, amongst a plurality of grounded and ungrounded secondary cables in the transformer, lead to a selected meter base, said method comprising the steps of: a. engaging a transmitter to the selected meter base; b. drawing a current with said transmitter; c. generating an electrical identification signal with said transmitter by way of the current; d. passing said electrical identification signal through the grounded secondary cable and the ungrounded secondary cable leading from the selected meter base to the transformer for generating a magnetic field around the grounded secondary cable and the ungrounded secondary cable; e. positioning a receiver within the transformer proximate to the terminal ends of the plurality of grounded and ungrounded secondary cables in the transformer; and, f. moving said receiver adjacent the terminal ends of each grounded and ungrounded secondary cable in the transformer to sense and detect said magnetic field being generated around the terminal ends of the grounded secondary cable or ungrounded secondary cable leading from the selected meter base to the transformer, thereby identifying same.

27. A method of identifying which grounded secondary cable or ungrounded secondary cable unearthed in a dug pit, amongst a plurality of grounded and ungrounded secondary cables unearthed within the dug pit, lead to a selected meter base, said method comprising the steps of: a. engaging a transmitter to the selected meter base; b. drawing a current with said transmitter; c. generating an electrical identification signal with said transmitter by way of the current; d. passing said electrical identification signal through the grounded secondary cable and the ungrounded secondary cable leading from the selected meter base to the transformer for generating a magnetic field around the grounded secondary cable and the ungrounded secondary cable; e. positioning a receiver within the dug pit proximate to the plurality of grounded and ungrounded secondary cables running therethrough; and, f. moving said receiver adjacent the plurality of grounded and ungrounded secondary cables running through the dug pit to sense and detect said magnetic field being generated around the grounded and the ungrounded secondary cables running through the pit and leading to the selected meter base.

* * * * *